United States Patent [19]
Choi et al.

[11] Patent Number: 5,936,887
[45] Date of Patent: Aug. 10, 1999

[54] NON-VOLATILE MEMORY DEVICE WITH NAND TYPE CELL STRUCTURE

[75] Inventors: Jung-Dal Choi; Dong-Jun Kim, both of Suwon; Wang-Chul Shin, Yongin-kun; Jong-Han Kim, Sungnam-shi, all of Rep. of Korea

[73] Assignee: Samsung Electronics Co., Ltd., Suwon, Rep. of Korea

[21] Appl. No.: 08/910,025

[22] Filed: Aug. 12, 1997

[30]     Foreign Application Priority Data

Aug. 13, 1996 [KR] Rep. of Korea ........................ 96-33594
Mar. 27, 1997 [KR] Rep. of Korea ........................ 97-10690

[51] Int. Cl.$^6$ ..................................................... G11C 11/34
[52] U.S. Cl. ................................ 365/185.17; 365/185.14; 365/185.05; 365/185.03
[58] Field of Search ............................. 365/218, 185.11, 365/185.01, 230.03

[56]             References Cited

U.S. PATENT DOCUMENTS

| 5,408,431 | 4/1995 | Challa ........................................ 365/218 |
| 5,528,537 | 6/1996 | Lee et al. ............................. 365/185.11 |
| 5,717,635 | 2/1998 | Akatsu .................................. 365/185.05 |
| 5,721,698 | 2/1998 | Lee et al. .................................. 365/104 |

*Primary Examiner*—Viet Q. Nguyen
*Attorney, Agent, or Firm*—Jones Volentine, L.L.P.

[57]             ABSTRACT

A non-volatile memory device is disclosed in which a pair of two adjacent memory cell strings are commonly connected to one bit line and the memory cell strings are selectively driven to obtain a relatively wide pitch margin between two bit lines. The device has a conductive plate line which is located along each memory cell string or a pair of memory cell strings to drive memory cells thereof with a relatively low program voltage to a word line. The memory device comprises a plurality of memory cell strings which are arranged in parallel with one another and each of which extends in the same direction as a bit line 12, and a pair of two adjacent memory cell strings 11a and 11b are commonly connected to the bit line 12. The memory device also comprises a string selector for selecting either the first string 11a or the second string 11b in response to signals from string select lines SSL1 and SSL2, and a plurality of plate lines PLa or 21a and PLb or 21b which are respectively arranged on the first and second strings 11a and 11b. In the memory cell, if voltages having different levels are applied to the control gate of a memory cell of the string selected thus and the plate line, at least more than two coupling voltages are induced to a floating gate of a corresponding memory cell so that two bits of information can be stored in and read out of one memory cell. The memory device has a cell structure in which a pair of two adjacent memory cell strings are commonly connected to one bit line, so that margin width between two bit lines, i.e., a bit line pitch can be relatively widely obtained.

14 Claims, 11 Drawing Sheets

NON-VOLATILE MEMORY DEVICE WITH NAND TYPE CELL STRUCTURE

FIELD OF THE INVENTION

The present invention relates to the field of multi-level storage in EEPROM memory technology. More particularly, this invention is an apparatus for storing into and reading several bits of information out of memory cells of a multi-bit flash EEPROM device.

BACKGROUND OF THE INVENTION

For the replacement of conventional hard disks by NAND EEPROMs, a very high density and a high programming speed are required. Besides hard disks, such NAND EEPROMs has been also used for mass storage media of electronic products such as a digital camera, a portable handy terminal and the like. An increased density of EEPROMs can be achieved by using multi-level memory cells. The EEPROMs may operate with low-consumption power. In case that EEPROMs are used as mass storage media, memory per-bit cost of the EEPROM should be further reduced.

A technique for significantly reducing the memory per-bit cost of flash EEPROM device has been disclosed in ISSCC TECHNICAL DIGEST, 1995, pp 132~133, "A Multilevel-Cell 32Mb Flash Memory". This flash EEPROM has multi-level memory cells, programmed voltages of each which can be several threshold voltages possible to represent two bits of information, i.e., "00", "01", "10" and "11". For example, "00", "01", "10" and "11" corresponds to threshold voltages of 2.5 [V], 1.5 [V]], 0.5 [V] and –3 [V], respectively. Thus, a programmed cell has one of the four threshold voltages.

However, since the above conventional flash EEPROM device requires a relatively high program voltage to achieve four threshold voltages per two bits, as compared with an EEPROM device capable of operating with two threshold voltages per two bits, and programming pulses corresponding to the four threshold voltages are sequentially supplied to word lines, a total programming time is lengthened. This causes the programming speed of the conventional EEPROM device to be lowered.

In order to implement EEPROM cells with multilevel, one of most important matters is to achieve a very narrow threshold voltage distribution per each threshold voltage level. For this reason, a technique for reducing a unit program pulse width and an incremental amount of programming voltage by using trapezoidal pulse has been disclosed in Symp. VLSI Technology Dig. Tech. Papers, 1995, pp 129~130, entitled "Fast and Accurate Programming Method for Multi-level NAND EEPROMs". A technique for reducing an incremental amount of programming voltages by using staircase program pulse has been also disclosed in ISSCC Dig. Tech. Papers, 1996, "A 3.3V 128 Mb Multi-level NAND Flash Memory for Mass Storage Applications". Since these flash memories has, however, relatively many in the number of program pulses and the number of incremental steps to those of EEPROM device with two levels per two bits, there is a problem that the total programming time is lengthened. Particularly, due to a relatively increased program voltage and the lengthened programming time, it is difficult to achieve threshold voltages of program inhibited cell within a given distribution boundary of each threshold voltage level.

SUMMARY OF THE INVENTION

It is therefore an object of the present invention to provide a non-volatile memory device in which a pair of two adjacent memory cell strings are commonly connected to one bit line and the memory cell strings are selectively driven to obtain a relatively wide pitch margin between two bit lines.

It is another object of the present invention to provide a non-volatile memory device in which a conductive plate line is located along each memory cell string or a pair of memory cell strings to drive memory cells thereof with a relatively low program voltage to a word line.

According to one aspect of the present invention, a non-volatile memory device with a multilevel cell structure, comprises a plurality of memory cell strings arranged in parallel with each other, each of said memory cell strings having a source contact, a bit line contact, a plurality of select transistors for selecting a group of memory cells of each memory cell strings, a plurality of floating gate memory cells for storing charges representing information, and said select transistors and floating gate memory cells being sandwiched in series between said source and said bit line contact; a plurality of bit lines, each of said bit lines being commonly connected to a pair of two adjacent memory cell strings of said memory cell strings so as to allow each bit line to share the pair of said two adjacent memory cell strings; said plurality of select transistors of a first memory cell string of said pair of memory cell strings, having first, second and third select transistors, the first and second select transistors of said first memory cell string being connected in series between said bit line contact and one end of both ends of said memory cells, and the third select transistor of said first memory cell string being connected between the source contact and the other end of said both ends; and said plurality of select transistors of a second memory cell string of said pair of memory cell strings, having first, second and third select transistors, the first and second select transistors of said second memory cell string being connected in series between said bit line contact and one end of both ends of said memory cells, and the third select transistor of said second memory cell string being connected between the source contact and the other end of said both ends.

In a preferred embedment, the memory device further comprises a plurality of plate lines, each of said plate lines being arranged on each memory cell string.

In a preferred embodiment, the memory device further comprises a plate line which is arranged on the pair of said two adjacent memory cell strings which are commonly connected to the bit line. The memory device may further comprises a plate line which is arranged on two adjacent memory cell strings between two adjacent pairs, each of which is comprised of two adjacent memory cell strings commonly connected to the bit line.

In a preferred embodiment, the first select transistor of said first memory cell string and the second select transistor of said second memory cell string are made of enhancement type MOS transistors, and the second select transistor of said first memory cell string and the first select transistor of said second memory cell string are made of depletion type MOS transistors.

According to another aspect of the present invention, a non-volatile memory device with a multilevel cell structure, comprises a semiconductor substrate having a main surface; a plurality of memory cell strings formed on the main surface said semiconductor substrate, a plurality of memory cells of each memory cell string being connected in series on the main surface, and each memory cell having a floating gate for storing charges representing information and a control gate on the floating gate with a dielectric layer therebetween; an insulating layer covering said memory cell strings; and a conductive plate layer formed on said insulating layer, wherein at least more than two coupling voltages are induced to the floating gate when different voltages are applied to the control gate and the plate layer, respectively, and thereby two bits of information are stored in and read out of one memory cell.

According to a further aspect of the present invention, a non-volatile memory device with a multilevel cell structure, comprises a semiconductor substrate having a main surface; a plurality of memory cell strings formed on the main surface said semiconductor substrate, a plurality of memory cells of each memory cell string being connected in series on the main surface, and each memory cell having a floating gate for storing charges representing information and a control gate on the floating gate with a dielectric layer therebetween; an insulating layer covering said memory cell strings; a conductive plate layer formed on said insulating layer; and a plurality of bit lines connected through contacts to said memory cell strings, each bit line being commonly connected to a pair of two adjacent memory cell strings of said memory cell strings, wherein at least more than two coupling voltages are induced to the floating gate when different voltages are applied to the control gate and the plate layer, respectively, and thereby two bits of information are stored in and read out of one memory cell.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

Figure 2:
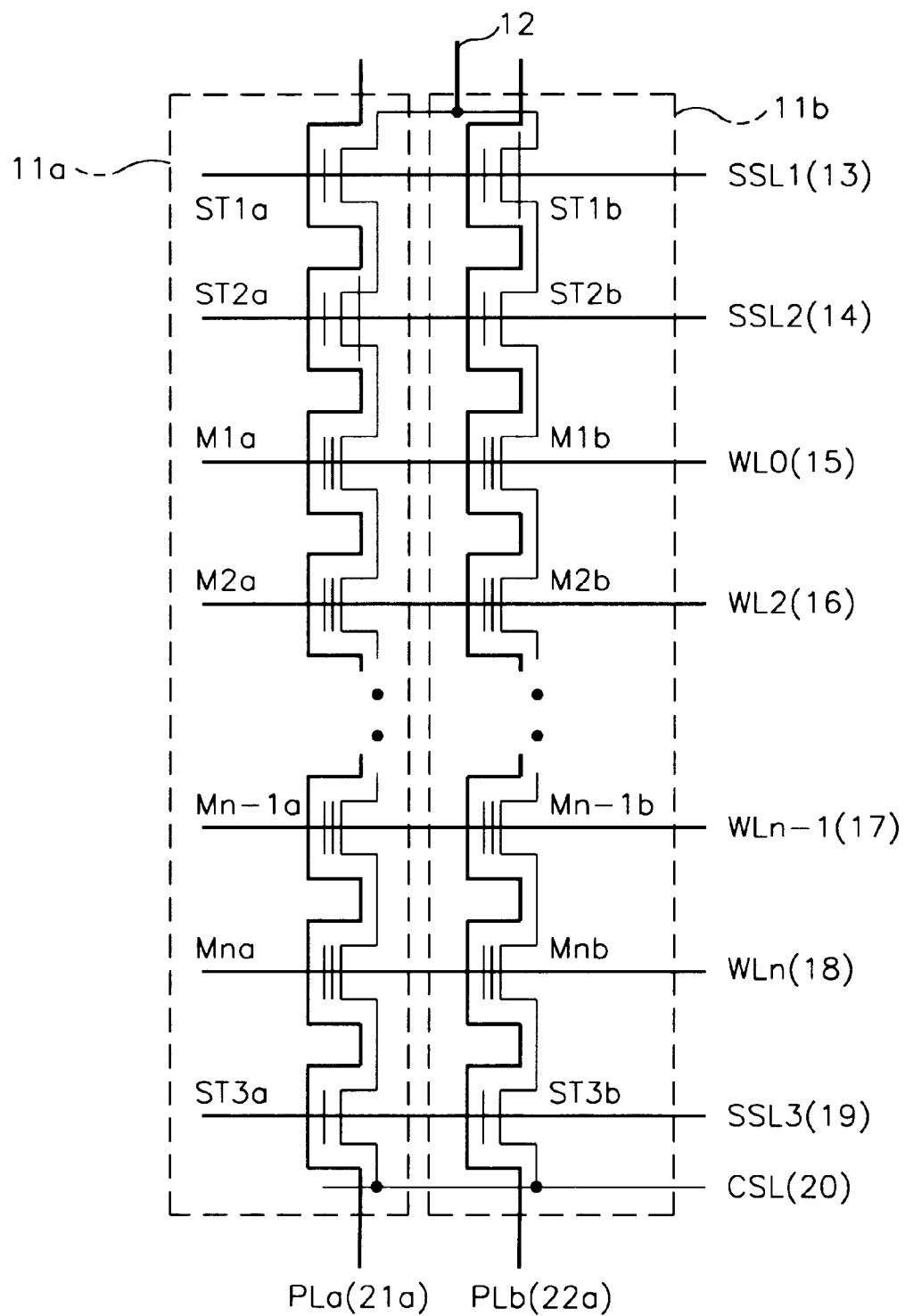
FIG. 2 is a diagram of an equivalent circuit of the EEPROM shown in FIG. 1.
Figure 3:
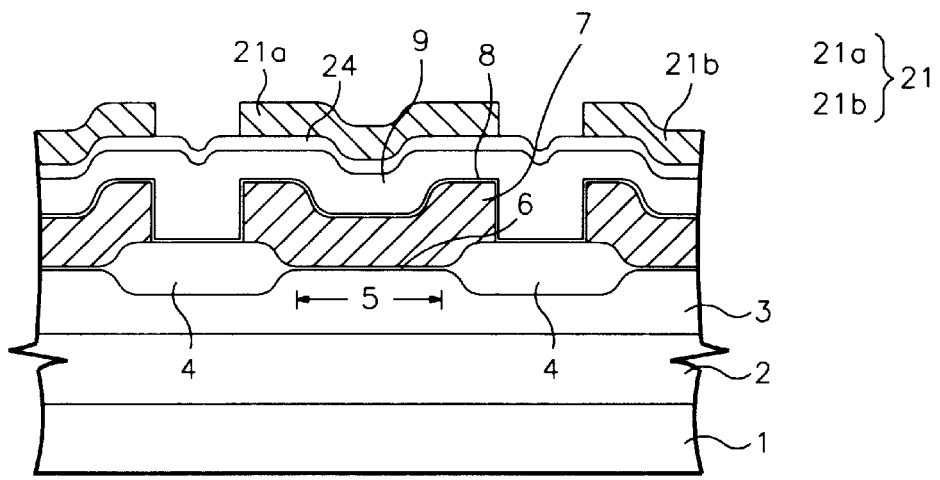
FIG. 3 is a sectional view taken along a line 3–3' of the EEPROM shown in FIG. 1.

Referring to FIGS. 2 and 3, a novel non-volatile memory device with NAND type cell structure in accordance with the present invention comprises a plurality of memory cell strings which are arranged in parallel with one another and each of which extends in the same direction as a bit line 12, and a pair of two adjacent memory cell strings 11a and 11b (hereinafter, referred to as "first and second strings" respectively) are commonly connected to the bit line 12. The non-volatile memory device also comprises means for selecting either the first string 11a or the second string 11b in response to signals from string select lines SSL1 and SSL2, and a plurality of plate lines PLa or 21a and PLb or 21b which are respectively arranged on the first and second strings 11a and 11b. In the memory cell, if voltages having different levels are applied to the control gate of a memory cell of the string selected thus and the plate line, at least more than two coupling voltages are induced to a floating gate of a corresponding memory cell so that two bits of information can be stored in and read out of one memory cell.

The non-volatile memory device according to the present invention has a cell structure in which a pair of two adjacent memory cell strings are commonly connected to one bit line, so that margin width between two bit lines, i.e., a bit line pitch can be relatively widely obtained. Thus, the above-mentioned cell structure can be adopted to a high density memory device. Also, a conductive plate line is located along each memory cell string, so that memory cells of each memory cell string can be driven with a relatively low program voltage which is applied to a word line, as compared with a conventional technique.

First Embodiment

Figure 1:
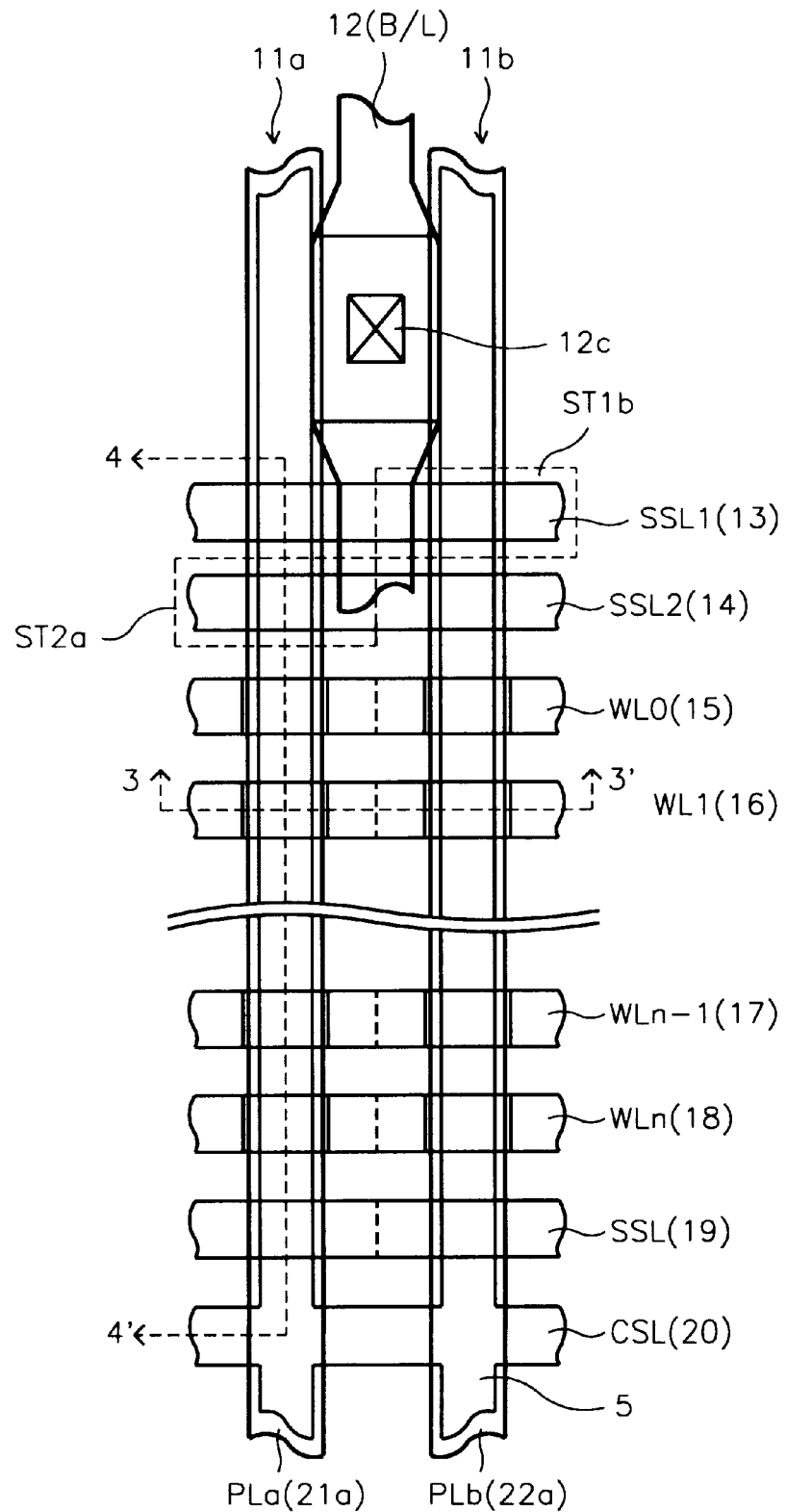
FIG. 1 is a plane view illustrating a part of NAND type flash EEPROM in accordance with a first embodiment of the present invention.

Referring to FIGS. 1 and 2, a novel non-volatile memory device, particularly, a flash EEPROM with NAND type cell structure in accordance with a first embodiment of the present invention is constructed in a manner that a pair of memory cell strings 11a and 11b (hereinafter, referred to as "first and second strings", respectively) are arranged per one bit line 12. Namely, the first and second strings 11a and 11b are commonly connected to the bit line 12. The first string 11a or the second string 11b is comprised of a plurality of select transistors and memory cells which are arranged in series between the bit line 12 and a common source line CSL or 20. The select transistors of the first and second strings 11a and 11b constitute a string selecting means for selecting either the first string 11a or the second string 11b.

As shown in FIG. 2, the string selecting means is comprised of two groups of select transistors (hereinafter, refereed to as "first and second groups of select transistors", respectively), one of which is provided to select the first string 11a and the other is provided to select the second string 11b. The first group of select transistors has first and second select transistors ST1a and ST2a which are connected in series between the bit line 12 and one end of both ends of a group of memory cells M1a~Mna connected in series in the first string 11a, and a third select transistor ST3a which is connected between a commonly source line CSL and the other end of both ends of the group of memory cells M1a~Mna. The second group of select transistors also has first and second select transistors ST1b and ST2b which are connected in series between the common source line CSL and one end of both ends of a group of memory cells M1b~Mnb connected in series in the second string 11b, and a third select transistor ST3b which is connected between the commonly source line CSL and the other end of said both ends of the group of memory cells M1b~Mnb. Since the first select transistor ST1a of the first string 11a and the second select transistor ST2b of the second string 11b are made of enhancement type MOS transistors, and the first select transistor ST1b of the second string 11b and the second select transistor ST2a of the first string 11a are made of depletion type MOS transistors, either the memory cells M1a~Mna of the first string 11a or the memory cells M1b~Mnb of the second string 11b can be selected in response to the signals from the string select lines SSL1 and SSL2. Also, the third select transistors ST3a and ST3b of the first and second strings 11a and 11b are formed of depletion type MOS transistors.

Referring again to FIG. 2, drains of the first string select transistors ST1a and ST1b of the respective strings 11a and 11b are commonly connected to the bit line 12, and gates thereof to a first string select line SSL1 or 13. Gates of the second string select transistors ST2a and ST2b of the respective strings 11a and 11b are commonly connected to a second string select line SSL2 or 14. Respective control gates of the memory cells of the first or the second string are commonly connected to corresponding word lines WL0~WLn or 15~18. Gates of the source select transistors ST3a and ST3b of the respective strings 11a and 11b are commonly connected to a source select line SSL3 or 19, and sources thereof to the common source line CSL or 20.

In this embodiment, it is illustrated from the figures that the floating gate memory cell is constituted by electrically erasable programmable read only memory. The memory cell may be also constituted by electrically programmable read only memory or mask programmable read only memory.

Also, plate lines PLa and PLb are, as shown in FIG. 2, located along the strings 11a or 11b and in the same direction as the bit line 12, respectively. The strings 11a and 11b are commonly connected through a contact 12c (shown in FIG. 1) to the bit lin 12, so that a pair of memory cell strings are shared by one bit line.

Figure 4:
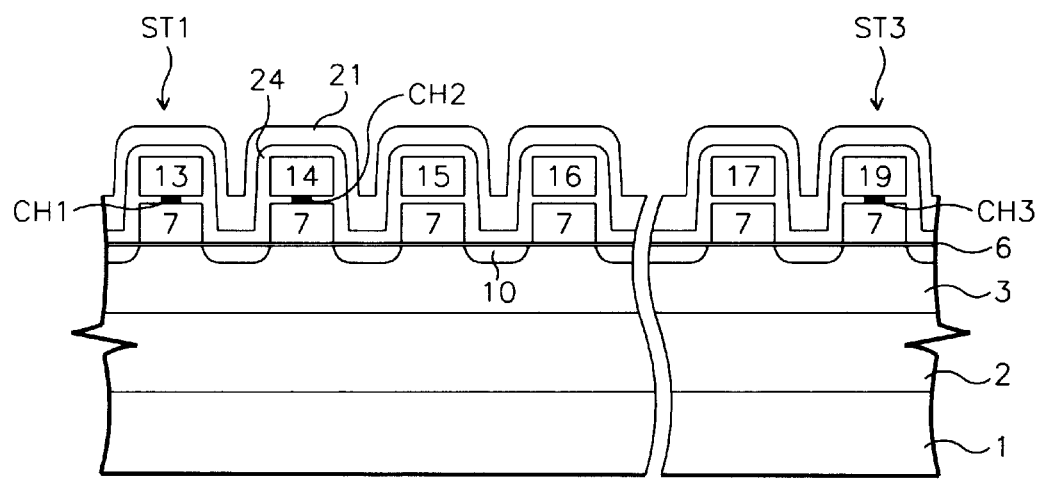
FIG. 4 is a sectional view taken along a line 4–4' of the EEPROM shown in FIG. 1.

FIGS. 3 and 4 are sectional views taken along lines 3–3' and 4–4' of the EEPROM shown in FIG. 1. From these figures, it can be seen that a plurality of plate lines 21a and 21b are formed on a control gate 9 with an insulating layer 24 interposed therebetween, and each of the plate lines is arranged on each memory cell string, particularly, only above a floating gate 7. Also, it can be seen from FIG. 4 that memory cell transistors at both sides of a string are used as MOS type select transistors by electrically connecting control and floating gates with each other.

As shown in FIGS. 3 and 4, an n− type well 2 is formed on a main surface of a p− type semiconductor substrate 1, and a p− type well 3 is formed on the well 2. The p− type well 3 is used as a body of the memory cells. On the p− type well 3, device isolating regions are formed to define an active region 5 therebetween. A gate insulating layer 6, the floating gate 7, a thin dielectric layer 8 and the control gate 9 are sequentially formed in a memory cell forming area of the active region 5, and a n+ type source/drain region 10 is formed at both sides of the floating gate 7 and in the well 3. Because a string or a source select transistor should be comprised of a MOS transistor as shown in FIG. 4, the gate insulating layer 6 is formed on the p− type well 3 of the active region, the floating gate 7 and the control gate 13 or 14 with the dielectric layer 8 therebetween are electrically connected with each other through a contact hole CH1 or CH2 to form a gate of a string select MOS transistor, and the floating gate 7 and the control gate 19 with the dielectric layer 8 therebetween are electrically connected with each other through a contact hole CH3 on the dielectric layer 8 to form a gate of a source select MOS transistor.

Also, as shown in FIG. 3, the insulating layer 24 having a thickness of about less than 500 Å, preferably about 100–500 Å is formed over the substrate, including the control gate 9, and plate electrodes 21a and 21b are respectively elongated on the insulating layer 24 above the active region 5. The insulating layer 24 is substantially formed more thicker on the upper surface of the control gate 9 than on both sides of each plate electrode or the upper surface of the source/drain region 10. An insulator such as a CVD oxide layer, a thermal oxide layer, an ONO insulating layer or the like may be used as the insulating layer 24, and a polysilicon layer or a tungsten polycide layer may be used as the plate electrode 21.

In the flash EEPROM having the above described structure, if two different voltages are simultaneously applied to the bit line 12 and the plate line 21, a coupling voltage is induced to the floating gate 7 of each memory cell of a string on the basis of the combination of the applied voltages. Then, the coupling voltage induced thus is more than any one of the four threshold voltage levels (corresponding to two bits of information) depending on a programmed voltage, so that the memory cell is programmed to one of the threshold voltages of four levels. Accordingly, the read operation of memory cells may be accomplished by detecting a certain amount of current flowing through each memory cell which is previously programmed to a threshold voltage.

Hereinafter, operation of the flash EEPROM device will be described in detail with reference to FIGS. 1 through 4.

1. Programming Operation of Memory Cell

The programming operation of the EEPROM device is performed after each memory cell is set to an initial state that a threshold voltage thereof becomes about −3 [V] corresponding to two bits of "11". Next, a voltage of 0 [V] is simultaneously applied to the selected bit line and the source select line SSL3 (or, 19), and at the same time a voltage of more than Vcc (i.e., a power supply voltage) is applied to the non-selected bit line and the first string select line SSL1 (or, 13) or the second string select line SSL2 (or, 14).

Also, to the selected word line of the word lines 15~18, a first high voltage (i.e., a program voltage) of, for instance, about 16 [V] is applied. As a result, Fowler-Nordheim (F-N) tunneling phenomenon is produced at the corresponding memory cell. Herein, to select the word line means that electrons are injected from channel into floating gate, and to non-select the word line means that no electrons are injected from channel into floating gate or discharged out of the floating gate and thus the floating gate continues to be maintained to a previous state.

If the memory cell should be programmed to data "00", the first high voltage of about 16 [V] is applied to the selected plate line, and if the memory cell to data "01", the second high voltage of about 10 [V] is applied to the selected plate line. If the memory cell should be programmed to data "10", a third high voltage of about 8 [V] is applied to the selected plate line, and if the memory cell to data "11", any of the first, second and third high voltages is applied to the selected plate line.

For example, if data to program a memory cell is "11", a high voltage of more than Vcc is applied to the selected bit line and any of the first, second and third high voltages is applied to the plate line. As a result, a voltage which allows F-N tunneling to be not generated is induced into the source/drain region 10 and the channel region of the memory cell owing to capacitance coupling, which is caused by applying the first high voltage to the plate line 21. The memory cell thus continues to be maintained to a threshold voltage of about −3 [V] applied due to the initial erasing operation thereof.

2. Erasing Operation of Memory Cell

To the p− type well 3 comprised of the body of the memory cells, an erase voltage of, for instance, about 16 [V] is applied. The selected word and plate lines only are applied with a voltage of 0 [V], and the others are set to floating state. As a result, electrons are discharged from the selected floating gate of the memory cell into the p− type well 3, whereby the erasing operation of the memory cell can be accomplished.

3. Reading Operation of Memory Cell

A bit line voltage $V_{B/L}$ of more than 0 [V] is applied to the bit line, a first read voltage Vread1 (e.g., 6 volts) of more than Vcc to the selected string and source select lines, and a voltage of 0 [V] to the source line. Also, a second read voltage Vread2 between the threshold voltages corresponding to "01" and "00" is applied to the selected word line, and a voltage of 0 [V] or a third read voltage Vread3 equal to either Vcc or Vread2 is applied to the selected plate line. At this time, a current difference between the bit line and the common source line occurs depending on levels of the programmed threshold voltage. Threshold voltages possible to represent two bits of information, "00", "01", "10" and "11" can be then detected from the memory cells.

For example, if "00"=2.5 [V], "01"=1.5 [V], "10"=0.5 [V] and "11"=−3 [V] the first read voltage Vread1 of about 6 [V] is applied to the non-selected word line and a voltage of about 2 [V] is applied to the selected word line. At that time, an amount of current flowing from the bit line to the common source line becomes "00"=0 $\mu$A, "01"=2~4 $\mu$A, "10"=6~10 $\mu$A and "11"=13~20 $\mu$A. The operation conditions of the EEPROM device are shown in the following Table 1.

respectively. The first and second high voltages are possible to cause F-N tunnelling in the floating gate and the third high voltage is impossible to cause F-N tunnelling in the floating gate. Also, the erasing voltage Verase of about 16 [V] is possible to cause F-N tunnelling in the body of the memory cells. The $V_{B/L}$ is 1~7 [V] and the first read voltage Vread1 is about 6 [V]. The second read voltage Vread2 is about 2 [V] larger than a threshold voltage corresponding to "01" and less than a threshold voltage corresponding to "00". The third read voltage Vread3 to the selected plate line is equal to the second read voltage Vread2, Vcc or 0 [V].

Second Embodiment

Figure 5:
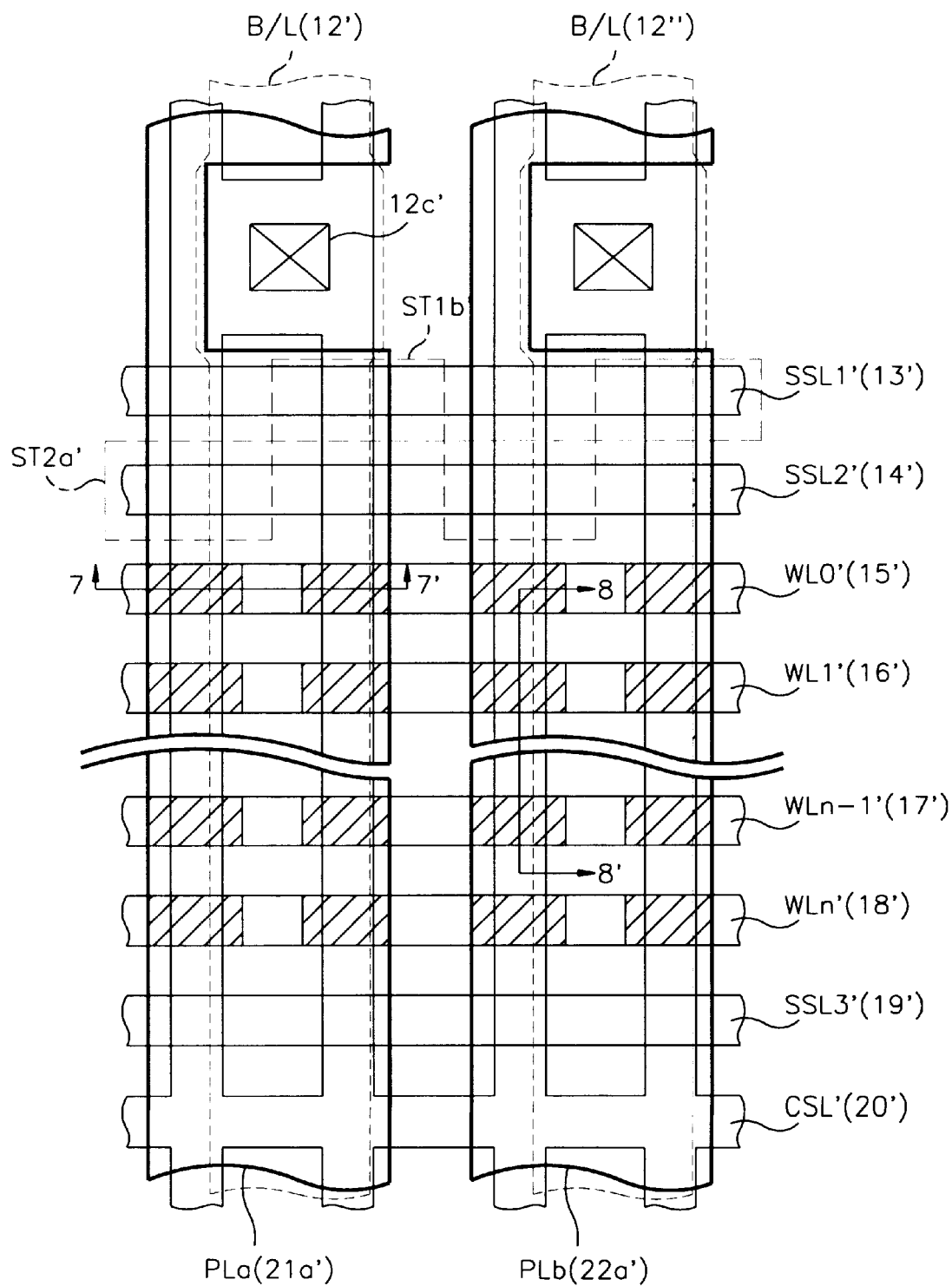
FIG. 5 is a plane view illustrating a part of NAND type flash EEPROM in accordance with a second embodiment of the present invention.

FIGS. 5 through 11 illustrate a flash EEPROM with NAND type cell structure in accordance with a second embodiment of the present invention. The EEPROM of FIG. 5 has the same construction as that of FIG. 1 except that a plate line is formed over a pair of two adjacent memory cell strings which are commonly connected to a bit line. In FIG. 5, component elements having similar functions to the component elements of the memory device of the first embodiment (shown in FIG. 1) are indicated by the same reference numerals, and descriptions thereof are omitted.

Figure 6:
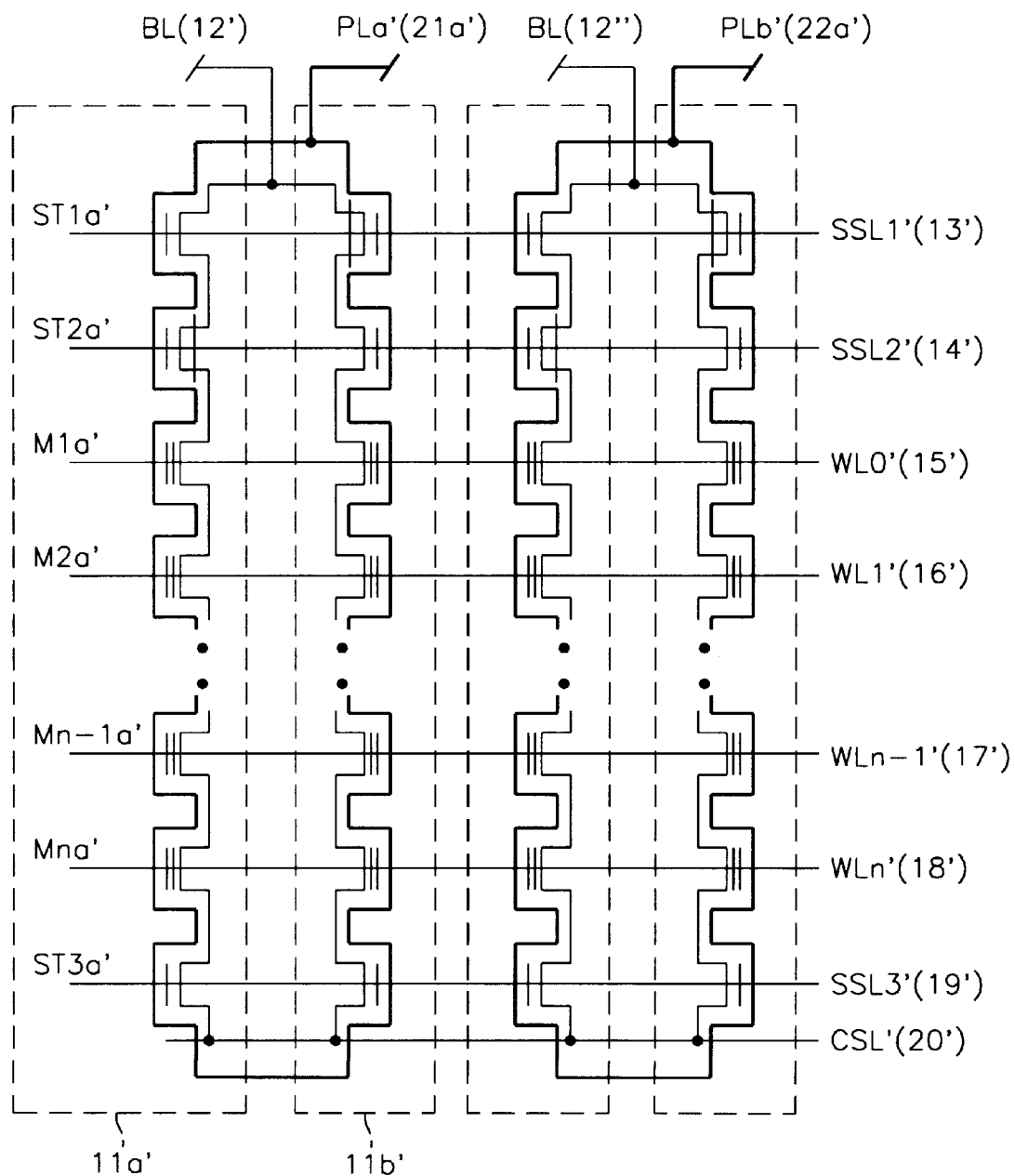
FIG. 6 is a diagram of an equivalent circuit of the EEPROM shown in FIG. 5.

As shown in FIGS. 5 and 6, pairs of two adjacent memory cell strings are commonly connected to bit lines 12' and 12", respectively. Plate lines 21a' and 22a' are also located on the pairs of two adjacent memory cell strings, respectively. In this embodiment, one plate line is located over one pair of two adjacent memory cell strings, dissimilarly to the first embodiment shown in FIG. 1.

Figure 7:
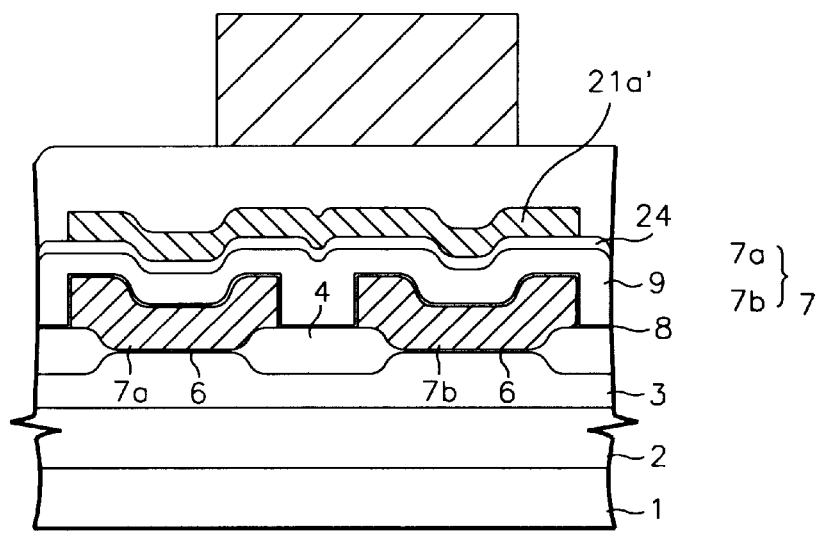
FIG. 7 is a sectional view taken along a line 7–7' of the EEPROM shown in FIG. 5.
Figure 8:
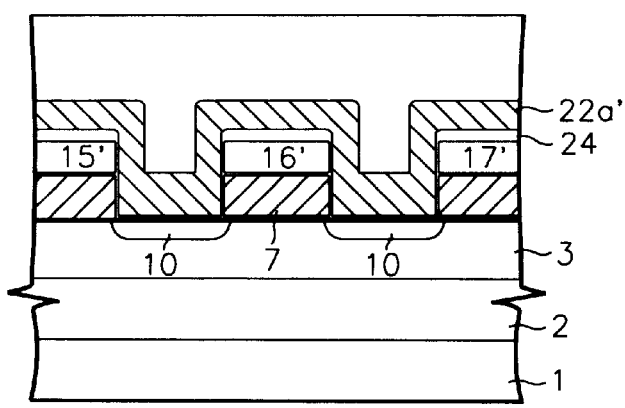
FIG. 8 is a sectional view taken along a line 8–8' of the EEPROM shown in FIG. 5.

FIGS. 7 and 8 are sectional views taken along lines 7–7' and 8–8' of the EEPROM shown in FIG. 5. It can be seen from FIG. 7 that a plate line 21a' is formed over a control gate 9 with an insulating layer 24 interposed therebetween, and located on a pair of two adjacent memory cell strings. That is, the plate line 21a' is overlapped with the pair of two adjacent memory cell strings and the plate line 22a' is overlapped with the pair of two another adjacent memory cell strings.

Figure 9:
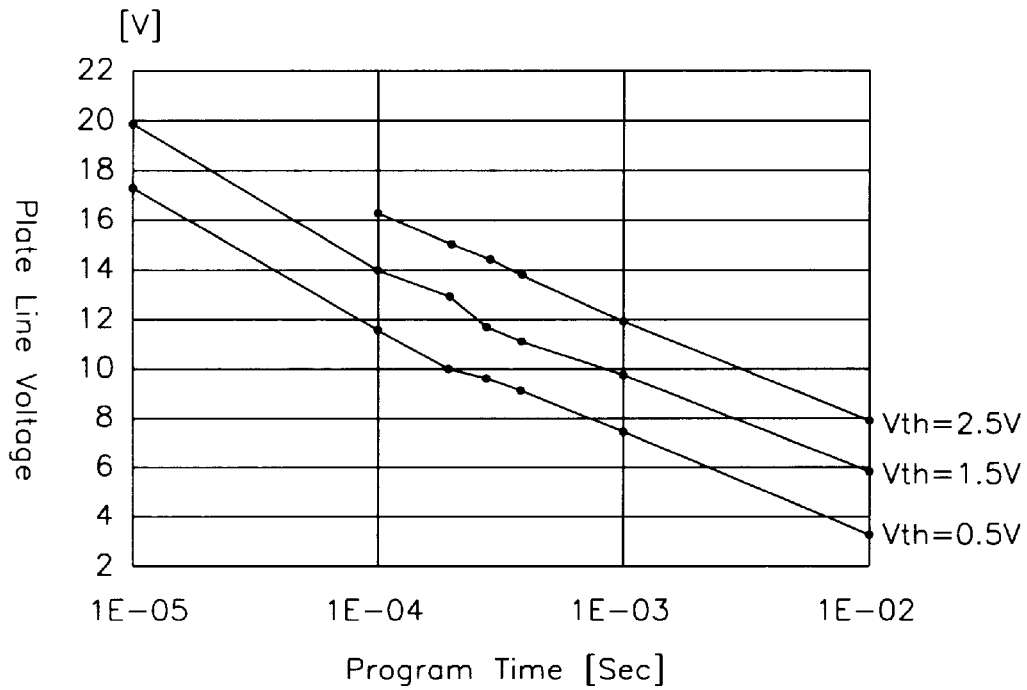
FIG. 9 is a graph diagram showing relationship between a program time and a plate voltage in the EEPROM of FIG. 5.

FIG. 9 shows that, when a program voltage of about 16 [V] is applied to the selected word line and a plate voltage

TABLE 1

|  | Program mode | Erase mode | Read mode |
|---|---|---|---|
| Non-selected B/L | more than Vcc | floating | $V_{B/L}$ |
| Selected B/L | 0 [V] | floating | $V_{B/L}$ |
| Non-selected Plate Line | 1st high voltage | floating | floating |
| Selected Plate line ("00") | 1st high voltage | 0 [V] | Vread3 or Vcc |
| Selected Plate line ("01") | 2nd high voltage | 0 [V] | Vread3 or Vcc |
| Selected Plate line ("10") | 3rd high voitage | 0 [V] | Vread3 or Vcc |
| Selected Plate line ("11") | 1st~3rd high voltage | 0 [V] | Vread3 or Vcc |
| SSL1(selected/non-selected) | more than Vcc/0[V] |  | Vread1/0 [V] |
| SSL2(selected/non-selected) | 0 [V]/more than Vcc |  | 0 [V]/Vreadl |
| Selected W/L | 1st high voltage | 0 [V] | Vread2 |
| Non-selected W/L | floating | floating | Vread 1 |
| SSL3(selected/non-selected) | Vcc/0 [V] | floating | Vread 1 |
| CSL(selected/non-selected) | floating | floating | 0 [V] |
| p-type Well (body) | 0 [V] | Verase | 0 [V] |

It can be also seen from the table 1 that the read operation of the EEPROM device can be accomplished by applying a fixed voltage to the selected word line and detecting a certain amount of current flowing through the corresponding memory cell. As can also be seen from the table 1, the second high voltage is larger than the first high voltage and less than the third high voltage. For example, the first, second and third high voltages are 16 [V], 12 [V] and 8 [V], to program a memory cell is applied to the plate line, program voltages are changed in accordance with a time. It can be seen from FIG. 9 that the program time can be reduced and a memory cell can be programmed with a relatively low program voltage by increasing capacitive coupling ratio owing to the plate line.

Figure 10:
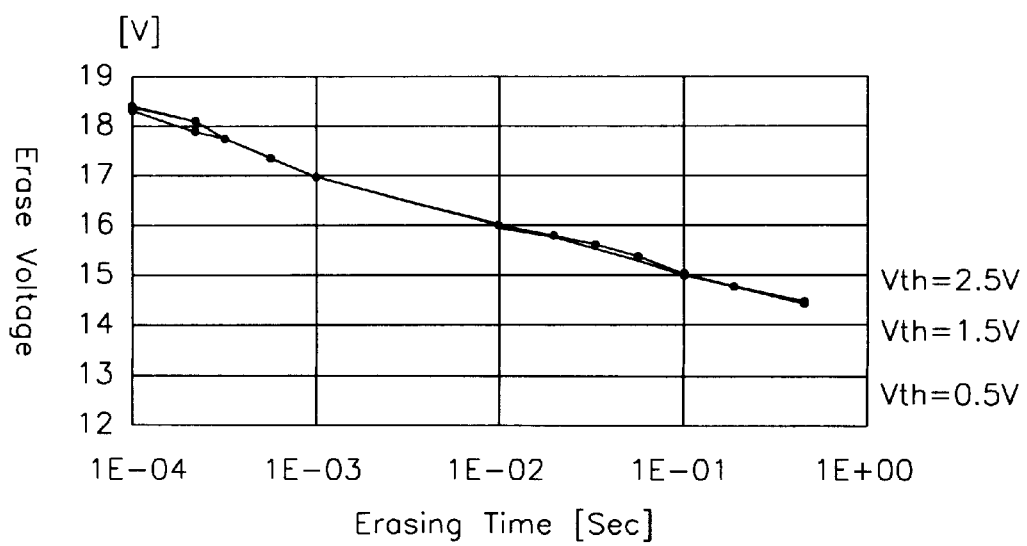
FIG. 10 is a graph diagram showing relationship between an erasing voltage and an erasing time in the EEPROM of FIG. 5.
Figure 11:
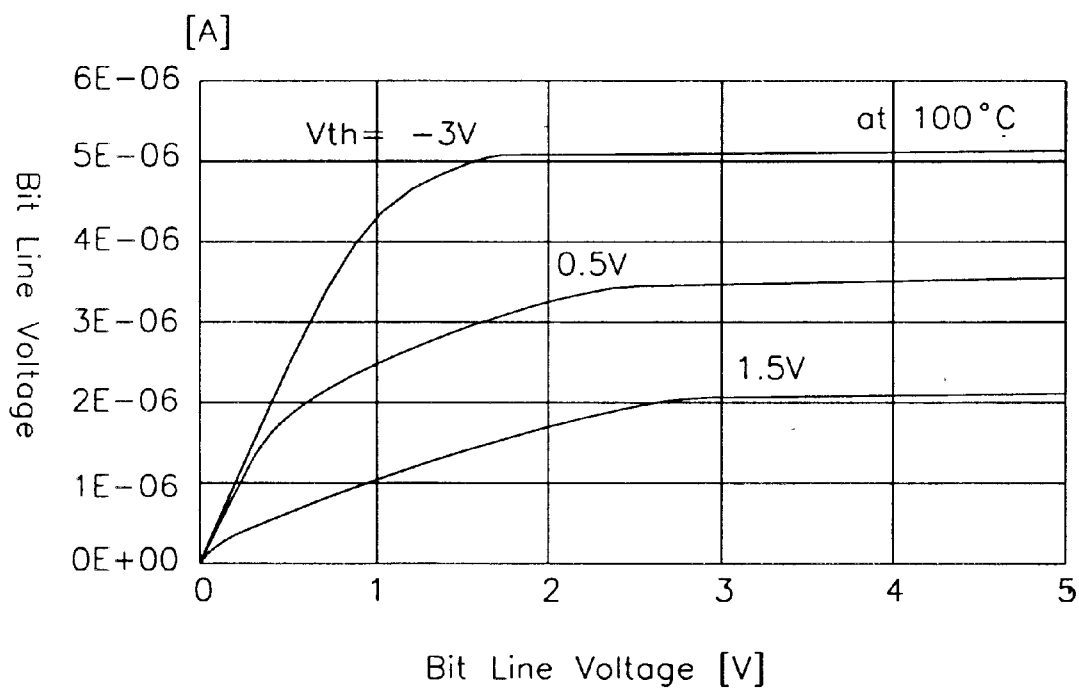
FIG. 11 is a graph diagram showing current-voltage characteristics of bit line of the EEPROM shown in FIG. 5.

FIG. 10 shows that, when a voltage of 0 [V] is applied to the word line and an erase voltage Verae to the p− type well, erasing characteristics are changed in accordance with a time. FIG. 11 shows current-voltage characteristics of the bit line, when 0/1.2/2.4 [V] and 0 [V] are applied to the selected word line and the plate line, respectively, and a pass voltage Vpass of 0.4 [V] to the non-selected word lines. In FIG. 11, Y-axis represents a bit line current and X-axis represents a bit line voltage. It can be seen from FIG. 11 that a current amount of about 2 μA is induced when the bit line voltage is above 2.5 [V].

Operating conditions performing the program, erase and read modes of the EEPROM device are shown in the following Table 2.

TABLE 2

|  | Program mode | Erase mode | Read mode |
| --- | --- | --- | --- |
| bit line: "00/01/10" | 0 [V] | floating | 1.8 [V] |
| bit line: "11" | more than Vcc | floating | 1.7 [V] |
| Non-selected Plate Line | 1st~3rd high voltage | floating | floating |
| Selected Plate line ("00") | 1st high voltage | 0 [V] | Vread3 |
| Selected Plate line ("01") | 2nd high voltage | 0 [V] | Vread3 |
| Selected Plate line ("10") | 3rd high voltage | 0 [V] | Vread3 |
| Selected Plate line ("11") | 1st high voltage | 0 [V] | Vread3 |
| SSL1(selected/non-selected) | more than Vcc/0[V] | floating | more than Vcc/0[V] |
| SSL2(selected/non-selected) | 0 [V]/more than Vcc | floating | 0[V]/more than Vcc |
| Selected Word Line | 4th high voltage | 0 [V] | Vread1~Vread3 |
| Non-selected Word Line | Vpass | floating | Vread4 |
| SSL3(selected/non-selected) | 0 [V] | floating | more than Vcc |
| CSL(selected/non-selected) | floating or 0 [V] | floating | 0 [V] |
| p-type Well (body) | 0 [V] | Verase | 0 [V] |

It can be understood from the Table 2 that the read operation of the EEPROM device according to the second embodiment can be accomplished by sequentially applying several read voltages of different levels to the selected word line and detecting a previously programmed threshold voltage from a corresponding memory cell, dissimilarly to the read operation of the EEPROM device according to the first embodiment.

Third Embodiment

Figure 12:
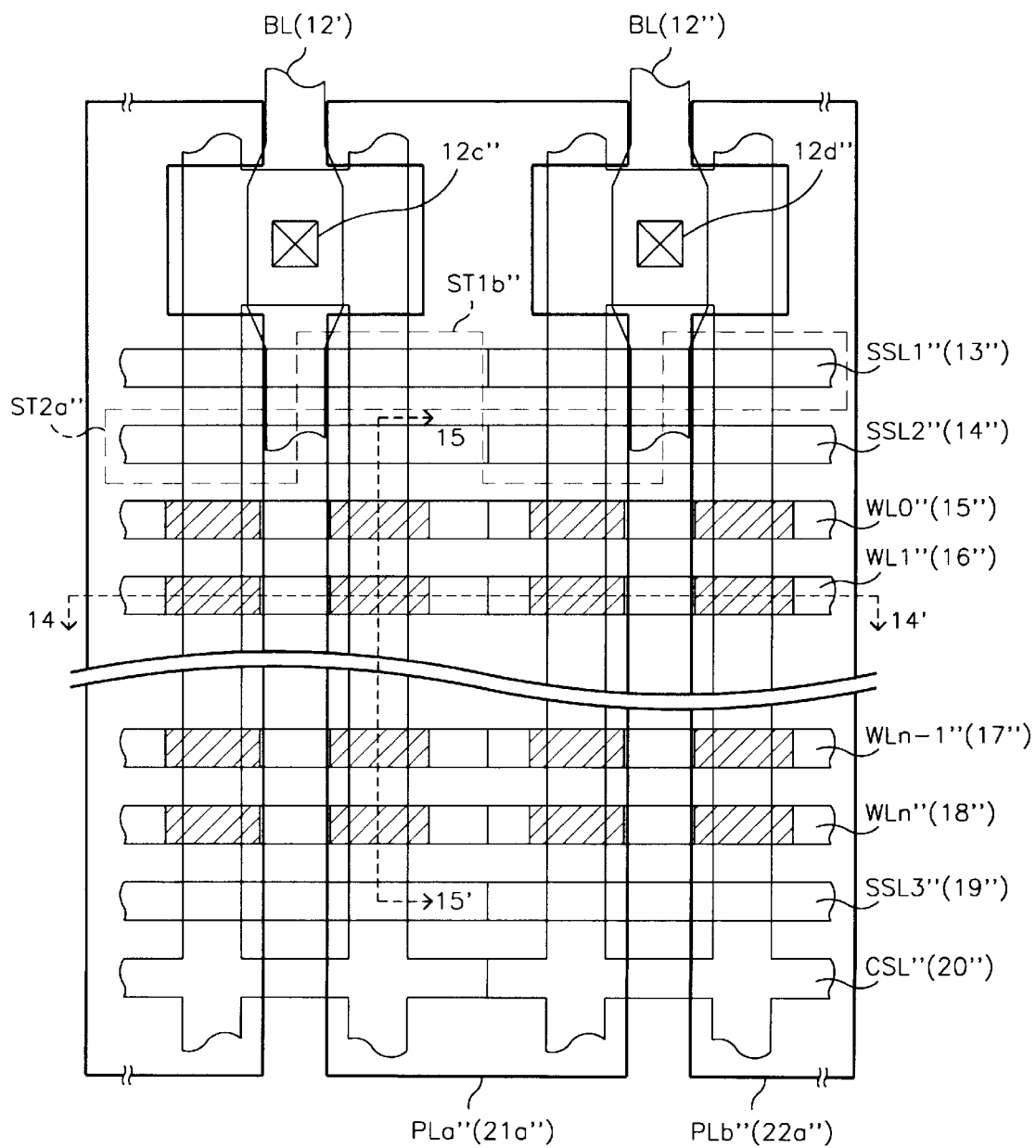
FIG. 12 is a plane view illustrating a part of NAND type flash EEPROM in accordance with a third embodiment of the present invention.

FIGS. 12 through 15 illustrate a flash EEPROM with NAND type cell structure in accordance with a third embodiment of the present invention. The EEPROM of FIG. 12 has the same construction as that of FIG. 5 except that a plate line is arranged on two adjacent memory cell strings between two adjacent pairs, each of which is comprised of two adjacent memory cell strings commonly connected to one bit line. In FIG. 12, component elements having similar functions to the component elements of the memory device of the second embodiment (shown in FIG. 5) are indicated by the same reference numerals, and descriptions thereof are omitted.

Figure 13:
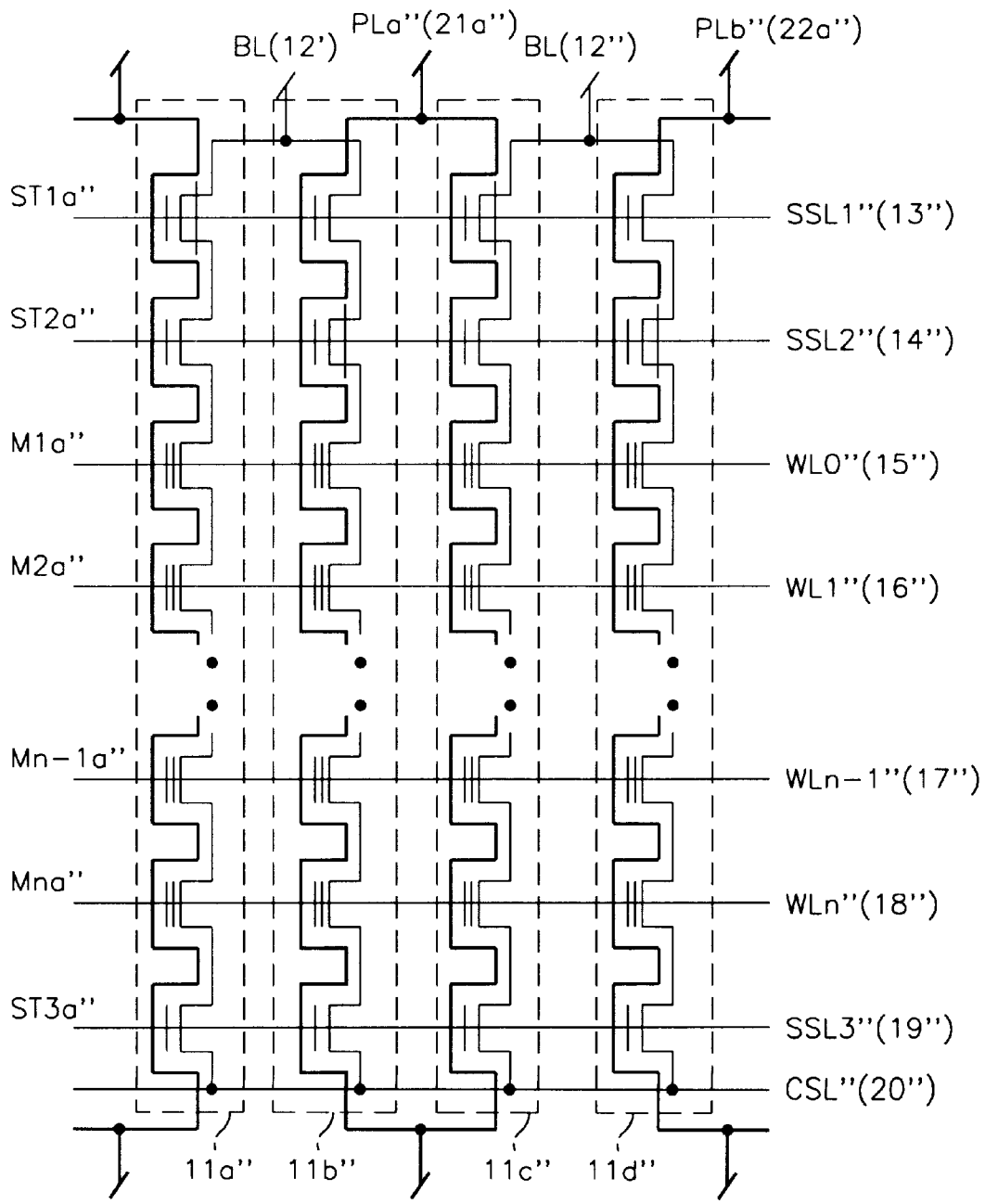
FIG. 13 is a diagram of an equivalent circuit of the EEPROM shown in FIG. 12.

Referring to FIGS. 12 and 13, pairs of two adjacent memory cell strings are commonly connected to bit lines 12' and 12", respectively. A plate line 21a' is formed on two adjacent memory cell strings between the two adjacent string pairs, and each of the two adjacent string pairs has two adjacent memory cell strings which are commonly connected to a bit line 12'. A plate line 22a" is also formed on two adjacent memory cell strings between the two adjacent string pairs, and each of the two adjacent string pairs has two adjacent memory cell strings which are commonly connected to a bit line 12". This embodiment is similar to the second embodiment in that one plate line is located over one pair of two adjacent memory cell strings, but dissimilarly to the second embodiment in that one plate line is located over a pair of two adjacent memory cell strings between two adjacent string pairs connected respectively to two different bit lines.

Figure 14:
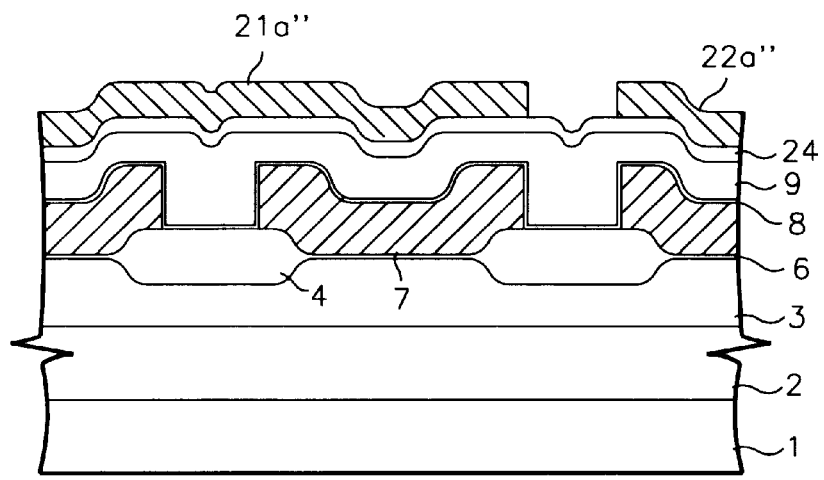
FIG. 14 is a sectional view taken along a line 14–14' of the EEPROM shown in FIG. 12.
Figure 15:
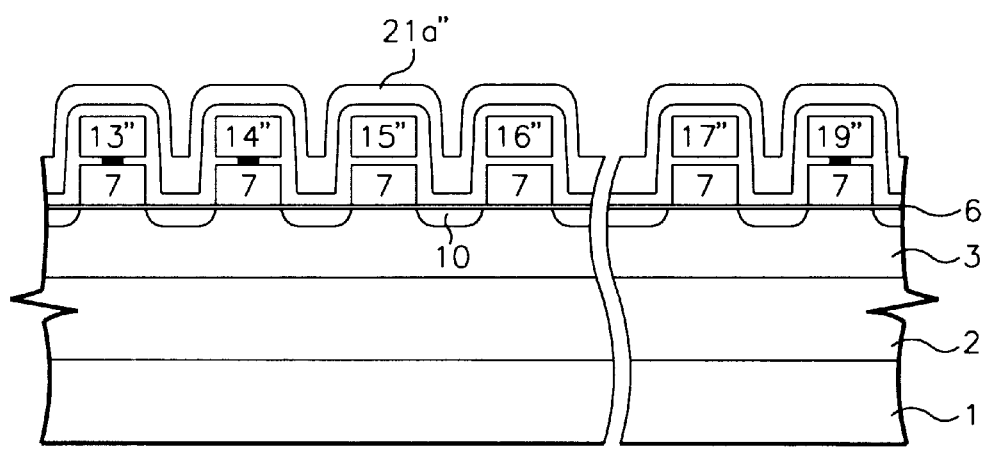
FIG. 15 is a sectional view taken along a line 15–15' of the EEPROM shown in FIG. 12.

FIGS. 14 and 15 are sectional views taken along lines 14–14' and 15–15' of the EEPROM shown in FIG. 12. It can be seen from FIG. 14 that a plate line 21a" is formed over a control gate 9 with an insulating layer 24 interposed therebetween, and located on a pair of two adjacent memory cell strings. That is, the plate line 21a" is overlapped with the pair of two adjacent memory cell strings and the plate line 22a" is overlapped with the pair of two another adjacent memory cell strings. The two adjacent memory cell strings covered by the plate line 21a" or 22a" are not commonly connected to one bit line dissimilarly to the arrangement of the second embodiment, but two adjacent memory cell strings between two string pairs connected respectively to two different bit lines are covered by the plate line 21a".

The program, erase and read modes of the EEPROM device are performed in the same manner as the operations of the EEPROM device of FIG. 5, and descriptions thereof are omitted.

As described above, an EEPROM device with NAND cell structure according to the present invention has a plate line covered over each string or a pair of two strings and thus allows a capacitive coupling voltage to be induced into a floating gate of the cell in accordance with program voltages applied to plate and bit lines, so that a programming time can be reduced and a program voltage can be further reduced by increasing a capacitive coupling rate.

The invention has been described using NAND type cell structure as exemplary preferred embodiment. However, NOR, AND or DINOR type cell structure can be used as the cell structure of a non-volatile memory device according to the present invention. Accordingly, it is to be understood that the scope of the invention is not limited to the disclosed embodiments.

What is claimed is:

1. A non-volatile memory device with a multilevel cell structure, comprising:
   a semiconductor substrate having a main surface;
   a plurality of memory cell strings formed on the main surface of said semiconductor substrate, a plurality of memory cells of each memory cell string being connected in series on the main surface, and each memory cell having a floating gate for storing charges representing information and a control gate on the floating gate with a dialectic layer therebetween;
   an insulating layer covering said memory cell strings; and a conductive plate layer formed on said insulating layer, wherein at least two coupling voltages are induced to at least one of the plurality of floating gates when different voltages are applied to the control gate and plate layer, respectively, and thereby two bits of information are stored and read out of one memory cell.

2. The non-volatile memory device of claim 1, wherein said conductive plate layer comprises one of polysilicon and polycide.

3. The non-volatile memory device of claim 1, wherein said conductive plate layer is formed along each memory cell string and above the floating gate of each memory cell.

4. The non-volatile memory device of claim 1, wherein said conductive plate layer is formed along the pair of said two adjacent memory cell strings which are commonly connected to the bit line.

5. The non-volatile memory device of claim 1, wherein said conductive plate layer is formed along two adjacent memory cell strings between two adjacent pairs, each of which is comprised of two adjacent memory cell strings commonly connected to the bit line.

6. The non-volatile memory device of claim 1, further comprising a selecting means for selecting a group of said memory cells in each memory cell string.

7. The non-volatile memory device of claim 6, wherein said selecting means comprises a plurality of select transistors which are made of the memory cells at both ends of the memory cell string.

8. The non-volatile memory device of claim 7, wherein each of said select transistors is made of MOS type.

9. The non-volatile memory device of claim 7, wherein each of said select transistors is made of a MOS transistor in which control and floating gates of the memory cell at both ends of said memory cell string are electrically connected with each other through a contact hole to serve as a gate of said MOS transistor.

10. A non-volatile memory device with a multilevel cell structure, comprising:

a semiconductor substrate having a main surface;

a plurality of memory cell strings formed on the main surface of said semiconductor substrate, a plurality of memory cells of each memory cell string being connected in series on the main surface, and each memory cell having a floating gate for storing charges representing information and a control gate on the floating gate with a dialectic layer therebetween;

an insulating layer covering said memory cell strings;

a conductive plate layer formed on said insulating layer; and a plurality of bit lines connected through contacts to said memory cell strings, each bit line being commonly connected to a pair of two adjacent memory cell strings of said memory cell strings, wherein at least two coupling voltages are induced to at least one of the plurality of floating gates when different voltages are applied to the control gate and plate layer, respectively, and thereby two bits of information are stored and read out of one memory cell.

11. The non-volatile memory device of claim 10, further comprising a selecting means for selecting a group of said memory cells in each memory cell string.

12. The non-volatile memory device of claim 11, wherein said selecting means comprises a plurality of select transistors which are made of the memory cells at both ends of said memory cell string.

13. The non-volatile memory device of claim 12, wherein each of said select transistors is made of MOS type.

14. The non-volatile memory device of claim 12, wherein each of said select transistors is made of a MOS transistor in which control and floating gates of the memory cell at both ends of said memory cell string are electrically connected with each other through a contact hole to serve as a gate of said MOS transistor.

* * * * *